United States Patent [19]

Arimoto

[11] Patent Number: 5,334,950
[45] Date of Patent: Aug. 2, 1994

[54] CLASS-AB PUSH-PULL DRIVE CIRCUIT

[75] Inventor: Masao Arimoto, Itami, Japan

[73] Assignee: Mitsubishi Denki Kabushiki Kaisha, Tokyo, Japan

[21] Appl. No.: 18,537

[22] Filed: Feb. 17, 1993

[30] Foreign Application Priority Data

Mar. 13, 1992 [JP] Japan .................. 4-055121

[51] Int. Cl.⁵ .................................. H03F 3/18
[52] U.S. Cl. ............................ 330/264; 330/269; 330/263; 330/262
[58] Field of Search ............... 330/264, 269, 263, 288, 330/277, 262

[56] References Cited

U.S. PATENT DOCUMENTS 4,042,839  8/1977  Araki ........................ 330/269
4,529,948  7/1985  Bingham ..................... 330/264

Primary Examiner—James B. Mullins
Assistant Examiner—J. Dudek
Attorney, Agent, or Firm—Leydig, Voit & Mayer

[57] ABSTRACT

The gate of a first source-grounded transistor and the input of a buffer circuit are directly connected to an input terminal of a class-AB push-pull circuit. An input signal directly drives the first source-grounded transistor and is transmitted through the buffer circuit to a voltage-to-current converter and converted into a current signal. On receipt of the current signal, an inverting amplifier develops a voltage of reversed polarity which is applied to the gate of a second source-grounded transistor to drive the second transistor. The drains of the first and second transistors are connected to each other and their connecting point serves as an output terminal of the circuit. A class-AB push-pull drive circuit having such an arrangement requires a significantly reduced input signal voltage and a reduced power supply voltage.

8 Claims, 2 Drawing Sheets

CLASS-AB PUSH-PULL DRIVE CIRCUIT

BACKGROUND OF THE INVENTION

1. Field of the Invention

The present invention relates to a class-AB push-pull drive circuit operable with a decreased input voltage as with a low power supply voltage.

2. Description of the Background Art

FIG. 2 is a circuit diagram of a conventional class-AB push-pull drive circuit disclosed in Japanese Patent Application No. 2-189908 by the applicant of the present application. The class-AB push-pull drive circuit of FIG. 2 comprises a buffer circuit 10, a voltage-to-current converter 20, and an inverting amplifier (or a current-to-voltage converter) 30.

The buffer circuit 10 includes an N-channel MOS transistor $Q_3$, a P-channel MOS transistor $Q_4$, and constant current sources $I_1$, $I_4$. The gate of the transistor $Q_3$ is connected to an input terminal 1; the source thereof is connected to the source of the transistor $Q_4$ and is grounded through the constant current source $I_4$; and the drain thereof is connected to a power supply terminal 100 for supplying a power supply voltage $V_{cc}$. The gate and drain of the transistor $Q_4$ are connected in common and are connected to the gate of the N-channel MOS transistor $Q_1$ serving as a first source-grounded transistor and are grounded through the constant current source $I_1$.

The voltage-to-current converter 20 includes N-channel MOS transistors $Q_5$, $Q_8$, and resistors $R_1$, $R_3$, $R_4$. The gate of the transistor $Q_8$ is connected to the drain thereof and to the gate of the transistor $Q_5$. The connecting point is connected to the source of the transistor $Q_3$ in the buffer circuit 10 through the resistor $R_1$. The source of the transistor $Q_8$ is grounded through the resistor $R_3$, and the source of the transistor $Q_5$ is grounded through the resistor $R_4$.

The inverting amplifier (current-to-voltage converter) 30 includes P-channel MOS transistors $Q_6$, $Q_7$, a constant current source $I_2$, and a resistor $R_2$. The source of the transistor $Q_6$ is connected to the power supply terminal 100, and the drain thereof is connected to the gate of the P-channel MOS transistor $Q_2$ serving as a second source-grounded transistor and to one end of the resistor $R_2$. The other end of the resistor $R_2$ is connected to the gate of the transistor $Q_7$ and to the drain of the transistor $Q_5$ in the voltage-to-current converter 20 and is also grounded through a constant current source $I_3$. The source of the transistor $Q_7$ is connected to the gate of the transistor $Q_6$ and is connected to the power supply terminal 100 through the constant current source $I_2$, and the drain thereof is grounded.

The drain of a transistor $Q_1$ is connected to an output terminal 2, and the source thereof is grounded. The drain of a transistor $Q_2$ is connected to the output terminal 2, and the source thereof is connected to the power supply terminal 100.

As output-side drive transistors in the class-AB push-pull drive circuit, the P-channel transistor $Q_2$ serving as the second source-grounded transistor is provided between the output terminal 2 and the power supply terminal 100, and the N-channel transistor $Q_1$ serving as the first source-grounded transistor is provided between the output terminal 2 and the ground. The buffer circuit 10, the voltage-to-current converter 20 and the inverting amplifier (current-to- converter) 30 are provided so that a potential difference between the bases of the transistors $Q_1$ and $Q_2$ is always held constant independently of the input voltage of the input terminal 1. The buffer circuit 10 converts a high-impedance input signal into a low-impedance signal and applies a voltage in accordance with the input voltage of the input terminal 1 to the gate of the transistor $Q_1$. The voltage-to-current converter 20 produces a current in accordance with the input voltage. The inverting amplifier (current-to-voltage converter) 30 converts the current again into a voltage which, when the input voltage is raised (or drops) and then a gate-source voltage $V_{GS1}$ increases (or decreases), accordingly causing a source-gate voltage $V_{SG2}$ of the transistor $Q_2$ to decrease (or increase). This permits the voltage sum $(V_{GS1}+V_{SG2})$ to be always held constant, so that the potential difference between the gates of the transistors $Q_1$ and $Q_2$ (i.e., $V_{CC}-(V_{GS1}+V_{SG2})$) is also always held constant.

With respect to a source voltage $V_{S3}$ of the transistor $Q_3$ in the buffer circuit 10 of the class-AB push-pull drive circuit, a source-gate voltage of the transistors $Q_4$ in the buffer circuit 10 is designated as $V_{SG4}$; the gate-source voltage of the transistor $Q_1$ for output drive is designated as $V_{GS1}$; a gate-source voltage of the transistor $Q_8$ in the voltage-to-current converter 20 is designated as $V_{GS8}$; and a drain-source current thereof is designated as $I_{DS8}$. Then the following relations hold.

$$V_{S3} = V_{SG4} + V_{GS1} \tag{1}$$

$$V_{S3} = V_{GS8} + I_{DS8} \cdot (R_1 + R_3) \tag{2}$$

where $R_1$, $R_3$ are resistances of the resistors $R_1$, $R_3$ in the voltage-to-current converter 20, respectively.

From Expressions (1) and (2), the drain-source current $I_{DS8}$ of the transistor $Q_8$ is given as:

$$I_{DS8} = \frac{V_{GS1} + V_{SG4} - V_{GS8}}{(R_1 + R_3)} \tag{3}$$

It is assumed that the transistors $Q_5$ and $Q_8$ in the voltage-to-current converter 20 provide a current mirror having a 1:1 mirror ratio. A drain current of the transistor $Q_5$ is designated as $I_{D5}$. Then the following relation holds.

$$I_{D5} = I_{DS8} \tag{4}$$

The source-gate voltage of the transistor $Q_2$ for output drive is designated as $V_{SG2}$; a source-gate voltage of the transistor $Q_6$ in the inverting amplifier 30 is designated as $V_{SG6}$; a drain current thereof is designated as $I_{D6}$; and a source-gate voltage of the transistor $Q_7$ in the inverting amplifier 30 is designated as $V_{SG7}$. Then the following relation holds.

$$V_{SG2} = V_{SG6} + V_{SG7} - R_2 \cdot I_{D6} \tag{5}$$

where $R_2$ is a resistance of the resistor $R_2$ in the inverting amplifier 30.

A constant bias current from the constant current source $I_3$ is designated as $I_{B3}$. The drain current $I_{D6}$ is expressed as:

$$I_{D6} = I_{D5} + I_{B3} \tag{6}$$

Therefore $$V_{SG2} = \tag{7}$$

-continued $$V_{SG6} + V_{SG7} - \frac{R_2}{R_1 + R_3}(V_{GS1} + V_{SG4} - V_{GS8}) - R_2 \cdot I_{B3}$$

A drain current of the transistor $Q_1$ is designated as $I_{D1}$; a constant determined by the configuration of the transistor $Q_1$ is designated as $\beta_1$; a drain current of the transistor $Q_2$ is designated as $I_{D2}$; a constant determined by the configuration of the transistor $Q_2$ is designated as $\beta_2$; a constant determined by the configuration of the transistor $Q_4$ is designated as $\beta_4$; a constant determined by the configuration of the transistor $Q_6$ is designated as $\beta_6$; a constant determined by the configuration of the transistor $Q_7$ is designated as $\beta_7$; and a constant determined by the configuration of the transistor $Q_8$ is designated as $\beta_8$. A threshold voltage of the N-channel MOS transistors is designated as $V_{THON}$; and a threshold voltage of the P-channel MOS transistors is designates as $V_{THOP}$. Since the source-drain currents of the transistors $Q_4$ and $Q_7$ are respectively equal to the constant bias currents $I_{B1}$ and $I_{B2}$ given from the constant current sources $I_1$ and $I_2$, the following relationships hold.

$$I_{D1} = \frac{\beta_1}{2}(V_{GS1} - V_{THON})^2 \quad (8)$$

$$I_{D2} = \frac{\beta_2}{2}(V_{SG2} - V_{THOP})^2 \quad (9)$$

$$I_{B1} = \frac{\beta_4}{2}(V_{SG4} - V_{THOP})^2 \quad (10)$$

$$I_{D6} = \frac{\beta_6}{2}(V_{SG6} - V_{THOP})^2 \quad (11)$$

$$I_{B2} = \frac{\beta_7}{2}(V_{SG7} - V_{THOP})^2 \quad (12)$$

$$I_{DS8} = \frac{\beta_8}{2}(V_{GS8} - V_{THON})^2 \quad (13)$$

Expressions (8) to (13) are respectively transformed into:

$$V_{GS1} = \sqrt{\frac{2 I_{D1}}{\beta_1}} + V_{THON} \quad (14)$$

$$V_{SG2} = \sqrt{\frac{2 I_{D2}}{\beta_2}} + V_{THOP} \quad (15)$$

$$V_{SG4} = \sqrt{\frac{2 I_{B1}}{\beta_4}} + V_{THOP} \quad (16)$$

$$V_{SG6} = \sqrt{\frac{2 I_{D6}}{\beta_6}} + V_{THOP} \quad (17)$$

$$V_{SG7} = \sqrt{\frac{2 I_{B2}}{\beta_7}} + V_{THOP} \quad (18)$$

$$V_{GS8} = \sqrt{\frac{2 I_{DS8}}{\beta_8}} + V_{THON} \quad (19)$$

Substitution of Expression (6) into Expression (17) gives:

$$V_{SG6} = \sqrt{\frac{2 (I_{D5} + I_{B3})}{\beta_6}} + V_{THOP} \quad (20)$$

Substitution of Expression (4) into Expression (20) gives:

$$V_{SG6} = \sqrt{\frac{2 (I_{DS8} + I_{B3})}{\beta_6}} + V_{THOP} \quad (21)$$

Substitution of Expressions (14) to (16), (18), (19), (21) into Expression (7) gives:

$$\sqrt{\frac{2 I_{D2}}{\beta_2}} + V_{THOP} = \quad (22)$$

$$\sqrt{\frac{2 (I_{DS8} + I_{B3})}{\beta_6}} + V_{THOP} +$$

$$\sqrt{\frac{2 I_{B2}}{\beta_7}} + V_{THOP} -$$

$$\frac{R_2}{R_1 + R_3}\left(\sqrt{\frac{2 I_{D1}}{\beta_1}} + V_{THON} + \right.$$

$$\left. \sqrt{\frac{2 I_{B1}}{\beta_4}} + V_{THOP} - \sqrt{\frac{2 I_{DS8}}{\beta_6}} - V_{THON}\right) - R_2 \cdot I_{B3}$$

Setting $R_1 + R_3 = R_2$ for the purpose of simplification, the following relation holds.

$$\sqrt{\frac{2 I_{D2}}{\beta_2}} = \sqrt{\frac{2 (I_{DS8} + I_{B3})}{\beta_6}} + \sqrt{\frac{2 I_{B2}}{\beta_7}} - \quad (23)$$

$$\sqrt{\frac{2 I_{D1}}{\beta_1}} - \sqrt{\frac{2 I_{B1}}{\beta_4}} + \sqrt{\frac{2 I_{DS8}}{\beta_8}} - R_2 \cdot I_{B3}$$

Therefore $$\sqrt{\frac{2 I_{D1}}{\beta_1}} + \sqrt{\frac{2 I_{D2}}{\beta_2}} = \sqrt{\frac{2 (I_{DS8} + I_{B3})}{\beta_6}} + \quad (24)$$

$$\sqrt{\frac{2 I_{B2}}{\beta_7}} + \sqrt{\frac{2 I_{DS8}}{\beta_8}} - \sqrt{\frac{2 I_{B1}}{\beta_4}} - R_2 \cdot I_{B3}$$

Since $I_{B1}$, $I_{B2}$, $I_{B3}$ are constant currents, the value on the right side of Expression (24) is approximately constant when variation of $I_{DS8}$ is small. Accordingly $$\sqrt{\frac{2 I_{D1}}{\beta_1}} + \sqrt{\frac{2 I_{D2}}{\beta_2}} = \text{const.} \quad (25)$$

Inserting $R_1 + R_3 = R_2$ in Expression (7) for the purpose of simplification, Expression (7) is transformed into:

$$V_{GS1} + V_{SG2} = V_{SG6} + V_{SG7} - V_{SG4} + V_{GS8} - R_2 \cdot I_{B3} \quad (26)$$

Since $I_{B1}$ and $I_{B2}$ are the constant currents, $V_{SG4}$ and $V_{SG7}$ are constant from Expressions (16) and (18). If the variation of $I_{DS8}$ is small as above described, $V_{GS8}$ and $V_{SG6}$ are also approximately constant from Expressions (19) and (20). Suitable setting of $R_2$ and $I_{B3}$ permits the value ($V_{GS1}+V_{SG2}$) to be always held constant. The potential difference between the gates of the transistors $Q_1$ and $Q_2$, which is equal to $V_{CC}-(V_{GS1}+V_{SG2})$, is always held constant by keeping the sum ($V_{GS1}+V_{SG2}$) constant.

A current flowing between the drains of the transistors $Q_2$ and $Q_1$ when there is no load current flow in the output terminal 2 is referred to as an idle current $I_{idle}$ expressed as:

$$I_{idle}=I_{D1}=I_{D2} \tag{27}$$

From Expression (24) is derived:

$$I_{idle} = \left( \frac{\sqrt{\frac{2(I_{DS8}+I_{B3})}{\beta_6}} + \sqrt{\frac{2 I_{B2}}{\beta_7}} + \sqrt{\frac{2 I_{DS8}}{\beta_8}} - \sqrt{\frac{2 I_{B1}}{\beta_4}} - R_2 \cdot I_{B3}}{\sqrt{\frac{2}{\beta_1}} + \sqrt{\frac{2}{\beta_2}}} \right)^2 \tag{28}$$

The idle current is minimized by increasing $R_2$ and $I_{B3}$ as shown by Expression (28).

When a load is connected to the output terminal 2 and an outflow current $I_{source}$ is present, the source-gate voltage $V_{SG2}$ of the transistor $Q_2$ increases. Since the potential difference between the gates of the transistors $Q_1$ and $Q_2$ is then approximately constant as described with reference to Expression (26), the gate-source voltage $V_{GS1}$ of the transistor $Q_1$ decreases and the drain current $I_{D1}$ of the transistor $Q_1$ accordingly decreases.

In this state, if a source-drain voltage of the transistor $Q_2$ is designated as $V_{SD2}$, a maximum voltage $V_{2max}$ of the output terminal 2 is given as:

$$V_{2max}=V_{CC}-V_{SD2} \tag{29}$$

Since the source-drain voltage $V_{SD2}$ of the transistor $Q_2$ is permitted to be sufficiently low (for example, 0.2 V or less), a high voltage approximately equal to the power supply voltage $V_{CC}$ is output.

Conversely, when a load is connected to the output terminal 2 and an inflow current $I_{sink}$ is present, the gate-source voltage $V_{GS1}$ of the transistor $Q_1$ increases. Since the potential difference between the gates of the transistors $Q_1$ and $Q_2$ is approximately constant as described with reference to Expression (26), the source-gate voltage $V_{SG2}$ of the transistor $Q_2$ decreases and the drain current $I_{D2}$ of the transistor $Q_2$ accordingly decreases.

In this state, if a drain-source voltage of the transistor $Q_1$ is designated as $V_{DS1}$, a minimum voltage $V_{2min}$ of the output terminal 2 is given as:

$$V_{2min}=V_{DS1} \tag{30}$$

Since the drain-source voltage $V_{DS1}$ of the transistor $Q_1$ is permitted to be sufficiently low (for example, 0.2 V or less), a low voltage approximate to the ground potential is output.

The operating voltage of the class-AB push-pull drive circuit of FIG. 2 will be described below. The respective transistors operate within a saturation region. Thus $$V_{CC}=V_{GS1}+V_{SG4}-I_{DS8}\cdot R_1-V_{GS5}+V_{DS5}+I_{D6}\cdot R_2+V_{SG2} \tag{31}$$

where $$I_{D6}\cdot R_2 + V_{SG2} = V_{SG6} + V_{SG7} \tag{32}$$

$$V_{GS1} = \sqrt{\frac{2 I_{D1}}{\beta_1}} + V_{THON} \tag{33}$$

$$V_{SG4} = \sqrt{\frac{2 I_{B1}}{\beta_4}} + V_{THOP} \tag{34}$$

$$V_{GS5} = \sqrt{\frac{2 I_{D5}}{\beta_5}} + V_{THON} \tag{35}$$

$$V_{SG2} = \sqrt{\frac{2 I_{D2}}{\beta_2}} + V_{THOP} \tag{36}$$

$$V_{SG6} = \sqrt{\frac{2 I_{D6}}{\beta_6}} + V_{THOP} \tag{37}$$

$$V_{SG7} = \sqrt{\frac{2 I_{B2}}{\beta_7}} + V_{THOP} \tag{38}$$

$$V_{DS5} \geq \sqrt{\frac{2 I_{D5}}{\beta_5}} \tag{39}$$

where $V_{GS5}$ is a gate-source voltage of the transistor $Q_5$, $V_{DS5}$ is a drain-source voltage thereof, and $\beta_5$ is a constant determined by the configuration of the transistor $Q_5$.

If a gate-source voltage of the transistor $Q_3$ is designated as $V_{GS3}$, an input voltage $V_1$ is expressed as:

$$V_1=V_{GS3}+V_{SG4}+V_{GS1} \tag{40}$$

Since the transistors $Q_1$, $Q_3$, $Q_4$ operate in the saturation region, the following relations hold.

$$V_{GS1} = \sqrt{\frac{2 I_{D1}}{\beta_1}} + V_{THON} \tag{41}$$

$$V_{GS3} = \sqrt{\frac{2 I_{D3}}{\beta_3}} + V_{THON} \tag{42}$$

$$V_{SG4} = \sqrt{\frac{2 I_{B1}}{\beta_4}} + V_{THOP} \tag{43}$$

Substitution of Expressions (41), (42), (43) into Expression (40) gives:

$$V_1 = \tag{44}$$

-continued $$\sqrt{\frac{2 I_{D1}}{\beta_1}} + \sqrt{\frac{2 I_{D3}}{\beta_3}} + \sqrt{\frac{2 I_{B1}}{\beta_4}} + 2V_{THON} + V_{THOP}$$

A drain current $I_{D3}$ of the transistor $Q_3$ is separated into constant currents $I_{B1}$, $I_{B4}$ and a drain-source current $I_{D8}$ of the transistor $Q_8$ as expressed by:

$$I_{D3} = I_{B1} + I_{B4} + I_{DS8} \quad (45)$$

Expression (44) is transformed into:

$$V_1 = \quad (46)$$

$$\sqrt{\frac{2 I_{D1}}{\beta_1}} + \sqrt{\frac{2 (I_{B1} + I_{B4} + I_{DS8})}{\beta_3}} + \sqrt{\frac{2 I_{B1}}{\beta_4}} +$$

$$2V_{THON} + V_{THOP}$$

As the input voltage $V_1$ is decreased, the currents $I_{D1}$ and $I_{DS8}$ decrease. As a result, a voltage across the resistor $R_2$ decreases, so that the source-gate voltage $V_{SG2}$ of the transistor $Q_2$ and, accordingly, the drain current $I_{D2}$ thereof increase. Conversely, as the input voltage $V_1$ is increased, the currents $I_{D1}$ and $I_{DS8}$ increase. As a result, the voltage across the resistor $R_2$ increases, so that the source-gate voltage $V_{SG2}$ of the transistor $Q_2$ and, accordingly, the drain current $I_{D2}$ thereof decrease.

In the conventional class-AB push-pull drive circuit having such arrangement, the operating power supply voltage $V_{CC}$ is calculated from Expression (31). Variable terms on the right side of Expression (31) are $I_{DS8} \cdot R_1$, $V_{DS5}$, and $I_{D6} \cdot R_2$. By setting the variable terms small, the operating power supply voltage $V_{CC}$ is considerably decreased. The input voltage $V_1$ required to drive the first and second source-grounded transistors $Q_1$ and $Q_2$ as output transistors must be at some minimum levels since it is necessary for the input voltage $V_1$ to operate the transistors $Q_3$ and $Q_4$ forming the buffer circuit 10 and the first source-grounded transistor $Q_1$ within the saturation region. When the power supply voltage $V_{CC}$ is decreased approximately to the threshold level of Expression (31), the required minimum input voltage sometimes reaches or exceeds the power supply voltage. In such cases, the output voltage is fixed to a certain voltage level, so that the linear relationship between the input and output is broken. The conventional class-AB push-pull drive circuit has been disadvantageous in that it is not practical decrease the power supply voltage $V_{CC}$ significantly.

SUMMARY OF THE INVENTION

According to the present invention, a class-AB push-pull drive circuit comprises: first and second power supply terminals for supplying first and second different power supply potentials, respectively; input and output terminals receiving input signals and producing output signals, respectively; a first transistor having a first electrode connected to the output terminal, a second electrode connected to the first power supply terminal, and a control electrode directly connected to the input terminal and receiving the input signal, conduction of the first transistor being controlled in accordance with a potential difference between the control and second electrodes, a second transistor of a polarity opposite to that of the first transistor having a first electrode connected to the output terminal, a second electrode connected to the second power supply terminal, and a control electrode, conduction of the second transistor being controlled in accordance with a potential difference between the control and second electrodes of the second transistor; a voltage-to-current converter coupled to the input terminal and having an output terminal for generating a current in accordance with the voltage of the input signal; and an inverting amplifier connected between the output terminal of the voltage-to-current converter and the control electrode of the second transistor for converting the current generated by the voltage-to-current converter into a voltage opposite in polarity to the current and applied to the control electrode of the second transistor.

The voltage input to the input terminal, which is required to operate the first transistor within the saturation region, has a small level since the gate of the first transistor is directly connected to the input terminal. The small voltage enables the second transistor to operate within the saturation region through the voltage-to-current converter and the inverting amplifier.

In the present invention, the control electrode of the first transistor is directly connected to the input terminal, and the control electrode of the second transistor is connected to the input terminal through the current-to-voltage converter and the inverting amplifier. This permits the input voltage to be decreased to a threshold voltage on which the first transistor is operable within the saturation region. Thus, operation with a low power supply voltage is achieved. Thus the output voltage widely ranges approximately from the ground voltage to the power supply voltage. Furthermore, the number of devices are reduced.

An object of the present invention is to provide a class-AB push-pull drive circuit operable with a decreased input voltage and with a low power supply voltage.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
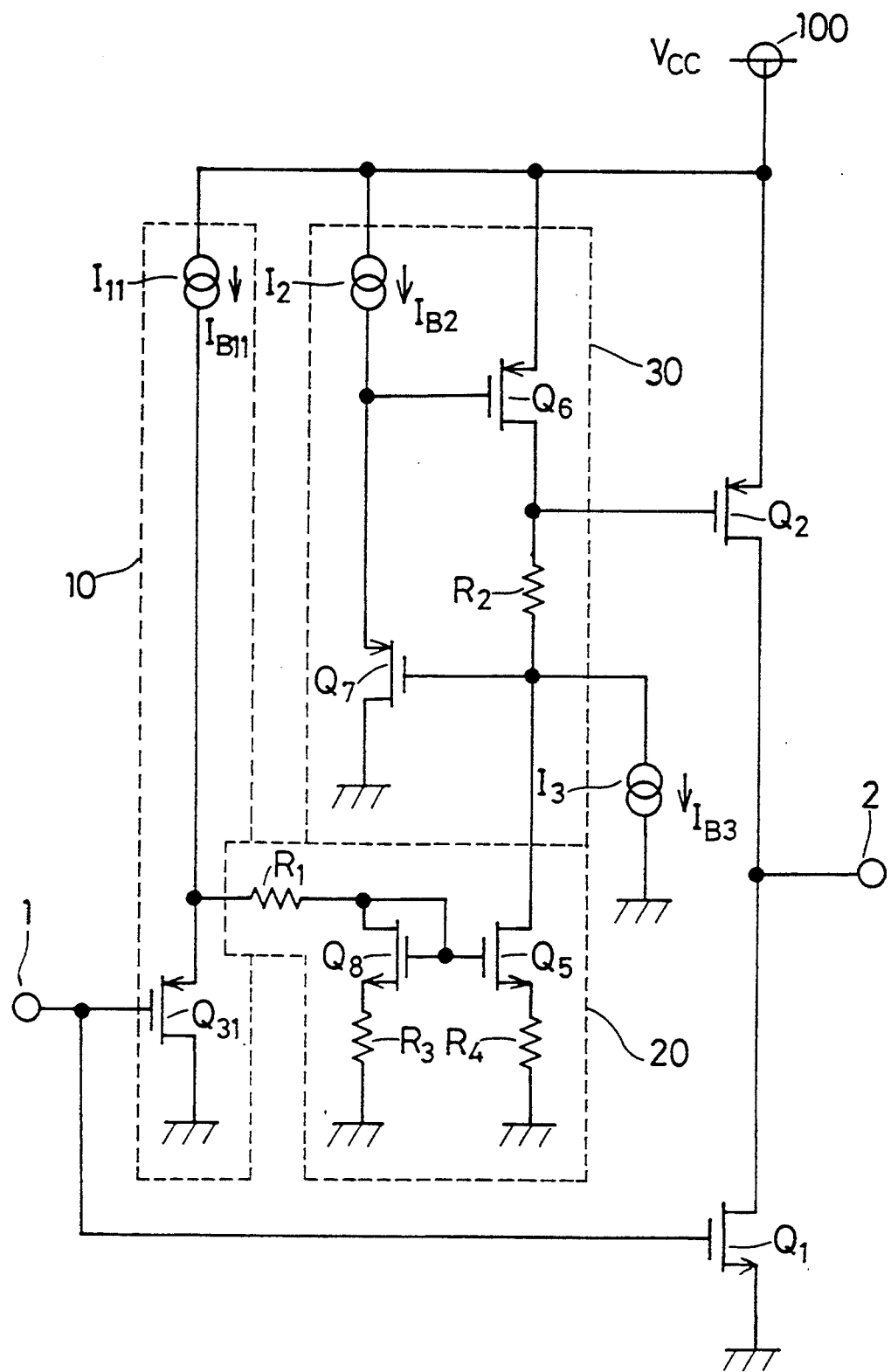
FIG. 1 is a circuit diagram of a class-AB push-pull drive circuit embodying the present invention.

FIG. 1 is a circuit diagram of a class-AB push-pull drive circuit of a preferred embodiment according to the present invention. The circuit of this preferred embodiment is different from the conventional circuit of FIG. 2 in that the gate-source voltage of the first source-grounded transistor $Q_1$ is not applied through the buffer circuit 10 but is applied directly from the input terminal 1 so that the buffer circuit 10 only drives the second source-grounded transistor $Q_2$.

Specifically, the gate of the transistor $Q_1$ is directly connected to the input terminal 1. The buffer circuit 10 includes a P-channel MOS transistor $Q_{31}$ and a constant current source $I_{11}$. The gate of the transistor $Q_{31}$ is connected to the input terminal; the source thereof is connected to the power supply terminal 100 through the constant current source $I_{11}$ and to one end of the resistor $R_1$ in the voltage-to-current converter 20; and the drain thereof is grounded. The other arrangements of the circuit of FIG. 1 are identical with those of the conventional circuit of FIG. 2.

Figure 2:
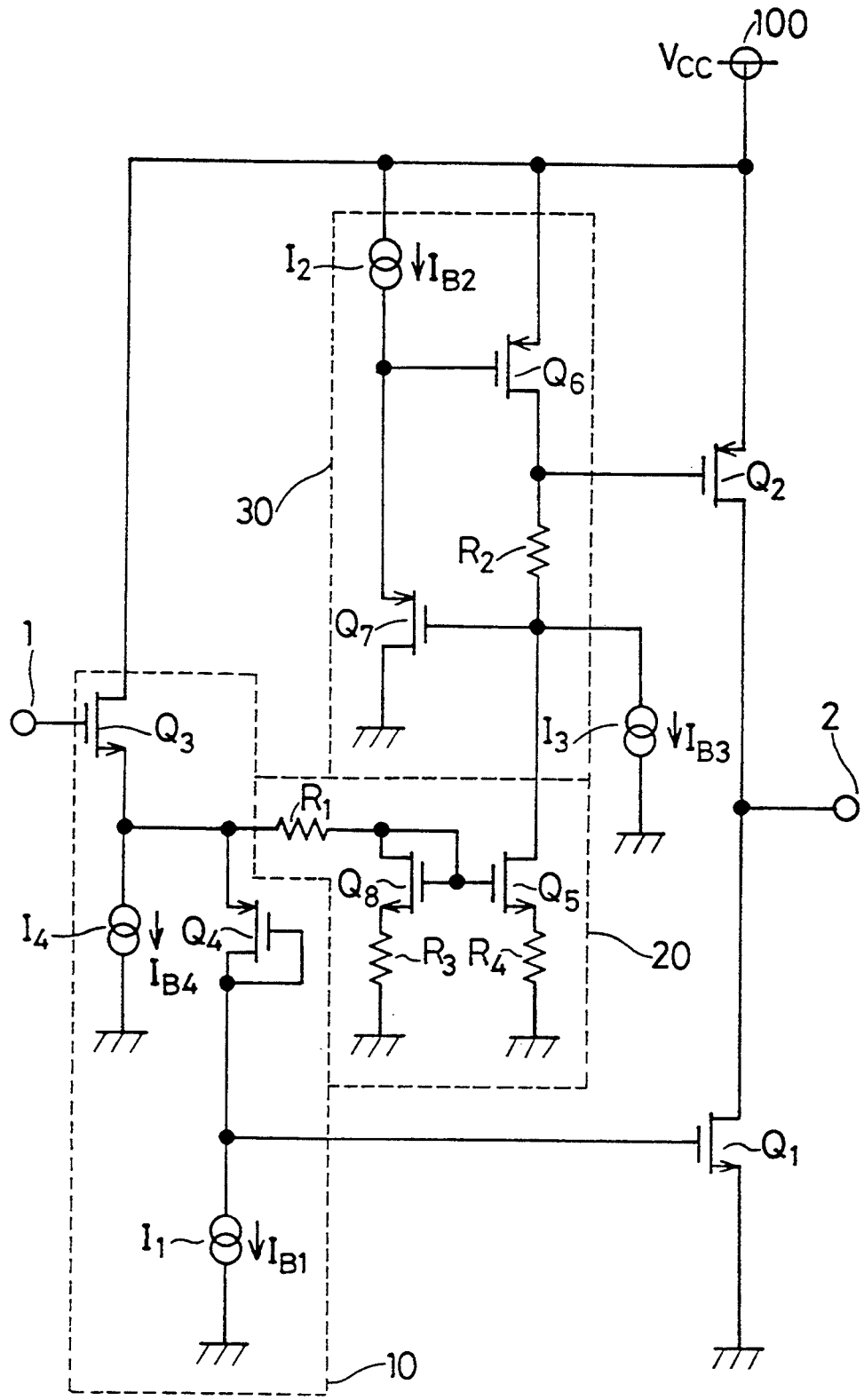
FIG. 2 is a circuit diagram of a conventional class-AB push-pull drive circuit.

In the operation in the circuit of FIG. 1 the potential difference between the gates of the transistors $Q_1$ and $Q_2$ (i.e., $V_{CC}-(V_{GS1}+V_{SG2})$) is always constant and is the same as that in the conventional circuit of FIG. 2.

With respect to a source voltage $V_{S31}$ of the transistor $Q_{31}$ in the buffer circuit 10 of the circuit of FIG. 1, the gate-source voltage of the transistor $Q_8$ is designated as $V_{GS8}$, and the drain-source current thereof is designated as $I_{DS8}$. Then $$V_{S31} = V_{GS8} + I_{DS8} \cdot (R_1 + R_3) \tag{47}$$

The input voltage $V_1$ to the input terminal 1 is equal to the gate-source voltage $V_{GS1}$ of the first source-grounded transistor $Q_1$ as expressed by:

$$V_1 = V_{GS1} \tag{48}$$

Using a source-gate voltage $V_{SG31}$ of the transistor $Q_{31}$, the following relation holds.

$$V_{S31} = V_{SG31} + V_1 \tag{49}$$

From Expressions (47) to (49), the drain-source current $I_{DSS}$ of the transistor $Q_8$ is expressed as:

$$I_{DS8} = \frac{V_{GS1} - V_{GS8} + B_{SG31}}{R_1 + R_3} \tag{50}$$

The transistors $Q_5$ and $Q_8$ provide a current mirror having a 1:1 mirror ratio. The drain current $I_{D5}$ of the transistor $Q_5$ is accordingly expressed as:

$$I_{D5} = I_{DS8} \tag{51}$$

For the second source-grounded transistor $Q_2$, Expressions (5) and (6) hold as described with reference to the conventional circuit of FIG. 2. Therefore $$V_{SG2} = V_{SG6} + V_{SG7} - \tag{52}$$

$$\frac{R_2}{R_1 + R_3}(V_{GS1} - V_{GS8} + V_{SG31}) - R_2 \cdot I_{B3}$$

A drain current of the transistor $Q_{31}$ is designated as $I_{D31}$, and a constant determined by the configuration of the transistor $Q_{31}$ is designated as $\beta_{31}$. Then $$I_{D31} = \frac{\beta_{31}}{2}(V_{SG31} - V_{THOP})^2 \tag{53}$$

From Expression (53) is derived:

$$V_{SG31} = \sqrt{\frac{2 I_{D31}}{\beta_{31}}} + V_{THOP} \tag{54}$$

Substitution of Expressions (14), (15), (18), (19), (21), (54) into Expression (52) gives the following Expression (55) (FIG. 1) in corresponding relation to Expression (22) (FIG. 2).

$$\sqrt{\frac{2 I_{D2}}{\beta_2}} + V_{THOP} = \sqrt{\frac{2(I_{DS8} + I_{B3})}{\beta_6}} + \tag{55}$$

$$V_{THOP} + \sqrt{\frac{2 I_{B2}}{\beta_7}} + V_{THOP} -$$

$$\frac{R_2}{R_1 + R_3}\left(\sqrt{\frac{2 I_{D1}}{\beta_1}} + V_{THON} - \sqrt{\frac{2 I_{DS8}}{\beta_8}} - \right.$$

$$\left. V_{THON} + \sqrt{\frac{2 I_{D31}}{\beta_{31}}} - V_{THOP} \right) - R_2 \cdot I_{B3}$$

Setting $R_1 + R_3 = R_2$ for the purpose of simplification, the following relation holds in corresponding relation to Expression (23).

$$\sqrt{\frac{2 I_{D2}}{\beta_2}} = \sqrt{\frac{2(I_{DS8} + I_{B2})}{\beta_6}} + \sqrt{\frac{2 I_{B2}}{\beta_7}} - \tag{56}$$

$$\sqrt{\frac{2 I_{D1}}{\beta_1}} + \sqrt{\frac{2 I_{DS8}}{\beta_8}} - \sqrt{\frac{2 I_{D31}}{\beta_{31}}} - R_2 \cdot I_{B3}$$

The expression corresponding to Expression (24) is:

$$\sqrt{\frac{2 I_{D1}}{\beta_1}} + \sqrt{\frac{2 I_{D2}}{\beta_2}} = \sqrt{\frac{2(I_{DS8} + I_{B3})}{\beta_6}} + \tag{57}$$

$$\sqrt{\frac{2 I_{B2}}{\beta_7}} + \sqrt{\frac{2 I_{DS8}}{\beta_8}} - \sqrt{\frac{2 I_{D31}}{\beta_{31}}} - R_2 \cdot I_{B3}$$

Since $I_{B1}$, $I_{B2}$, $I_{B3}$ are constant currents, the value on the right side of Expression (57) is approximately constant when variations of $I_{DS8}$, $I_{D31}$ are small. Accordingly $$\sqrt{\frac{2 I_{D1}}{\beta_1}} + \sqrt{\frac{2 I_{D2}}{\beta_2}} = const. \tag{58}$$

Inserting $R_1 + R_3 = R_2$ in Expression (52) for the purpose of simplification, Expression (52) is transformed into:

$$V_{GS1} + V_{SG2} = V_{SG6} + V_{SG7} - V_{SG31} + V_{GS8} - R_2 \cdot I_{B3} \tag{59}$$

Since $I_{B2}$ is the constant current, it is apparent from Expression (18) that $V_{SG7}$ is constant. It is also apparent from Expressions (19), (21), (54) that $V_{GS8}$, $V_{SG6}$, $V_{SG31}$ are approximately constant when the variations of $I_{DS8}$, $I_{D31}$ are small as above described. Suitable setting of $R_2$, $I_{B3}$ permits the value ($V_{GS1}+V_{SG2}$) to be always held constant. The potential difference between the gates of the transistors $Q_1$ and $Q_2$, which is equal to $V_{CC}-(V_{GS1}+V_{SG2})$, is always held constant by holding the value ($V_{GS1}+V_{SG2}$) constant.

When there is no load current flow in the output terminal 2, Expression (57) is expressed from Expression (27) as:

$$I_{idle} = \left( \frac{\sqrt{\frac{2(I_{DS8} + I_{Be})}{\beta_6}} + \sqrt{\frac{2 I_{B2}}{\beta_7}} + \sqrt{\frac{2 I_{DS8}}{\beta_8}} - \sqrt{\frac{2 I_{D31}}{\beta_{31}}} - R_2 \cdot I_{B3}}{\sqrt{\frac{2}{\beta_1}} + \sqrt{\frac{2}{\beta_2}}} \right) \quad (60)$$

It is apparent from Expression (60) that the idle current $I_{idle}$ flowing between the drains of the transistors $Q_1$ and $Q_2$ is minimized by increasing $R_2$ and $I_{B3}$.

The maximum and minimum output voltages $V_2$ to be outputted to the output terminal 2 are calculated from Expressions (29) and (30), respectively. The voltage outputted from the output terminal 2 ranges approximately from a voltage adjacent the ground potential to the power supply voltage $V_{CC}$ in the same fashion as the conventional circuit of FIG. 2.

The operation voltage will now be discussed hereinafter. The respective transistors operate within the saturation region. The following expression holds in corresponding relation to Expression (31) (FIG. 2):

$$V_{CC} = V_{GS1} + V_{SG31} - I_{DS8} \cdot R_1 - V_{GS5} + V_{DS5} + I_{D6} \cdot R_2 + V_{SG2} \quad (61)$$

where $$I_{D6} \cdot R_2 + V_{SG2} = V_{SG6} + V_{SG7} \quad (62)$$

$$V_{GS1} = \sqrt{\frac{2 I_{D1}}{\beta_1}} + V_{THON} \quad (63)$$

$$V_{SG2} = \sqrt{\frac{2 I_{D2}}{\beta_2}} + V_{THOP} \quad (64)$$

$$V_{GS5} = \sqrt{\frac{2 I_{D5}}{\beta_5}} + V_{THON} \quad (65)$$

$$V_{SG6} = \sqrt{\frac{2 I_{D6}}{\beta_6}} + V_{THOP} \quad (66)$$

$$V_{SG7} = \sqrt{\frac{2 I_{B2}}{\beta_7}} + V_{THOP} \quad (67)$$

$$V_{SG31} = \sqrt{\frac{2 I_{D31}}{\beta_{31}}} + V_{THOP} \quad (68)$$

$$V_{DS5} \geq \sqrt{\frac{2 I_{D5}}{\beta_5}} \quad (69)$$

In the class-AB push-pull drive circuit of FIG. 1, the operating power supply voltage $V_{CC}$ is calculated from Expression (61). Variable terms on the right side of Expression (61) are $I_{DS8} \cdot R_1$, $I_{D6} \cdot R_2$ and $V_{SG31}$. The operating power supply voltage $V_{CC}$ is considerably decreased by setting the variable terms small.

It is necessary that the input voltage $V_1$ satisfies the following expression in corresponding relation to Expression (40) (FIG. 2) from Expression (48).

$$V_1 = V_{GS1} = \sqrt{\frac{2 I_{D1}}{\beta_1}} + V_{THON} \quad (70)$$

It is also necessary that the following expression holds in corresponding relation to Expression (46) (FIG. 2) from Expression (50).

$$V_1 = V_{GS8} - V_{SG31} + I_{DS8} \cdot (R_1 + R_3) = \quad (71)$$

$$\sqrt{\frac{2 I_{DS8}}{\beta_8}} - \sqrt{\frac{2 I_{D31}}{\beta_{31}}} + I_{DS8} \cdot (R_1 + R_3) +$$

$$V_{THON} - V_{THOP}$$

The input voltage $V_1$ should be adapted to fall in a range that permits the transistors $Q_1$ and $Q_{31}$ to operate within the saturation region (which satisfies Expressions (70) and (71), respectively). Adjustment of the terms $I_{DS8}(R_1 + R_3)$ of Expression (71) enables the level of the input voltage $V_1$ given by Expression (70) to be minimized. This minimum level may be made much lower than the minimum level of the input voltage $V_1$ required in the conventional circuit of FIG. 2.

While the invention has been shown and described in detail, the foregoing description is in all aspects illustrative and not restrictive. It is therefore understood that numerous modifications and variations can be devised without departing from the scope of the invention.

I claim:

1. A class-AB push-pull circuit comprising:

first and second power supply terminals for supplying first and second power supply potentials, respectively;

input and output terminals for receiving an input signal voltage and outputting an output signal, respectively;

a first transistor having a polarity, a first electrode connected to said output terminal, a second electrode connected to said first power supply terminal, and a control electrode directly connected to said input terminal for receiving the input signal voltage, conduction of said first transistor being controlled in accordance with a potential difference between said control and second electrodes of said first transistor;

a second transistor having a polarity opposite to the polarity of said first transistor, a first electrode connected to said output terminal, a second electrode connected to said second power supply terminal, and a control electrode, conduction of said second transistor being controlled in accordance with a potential difference between said control and second electrodes of said second transistor;

a voltage-to-current converter having an output terminal and coupled to said input terminal for generating a current in response to the input signal voltage;

an inverting amplifier connected between said output terminal of said voltage-to-current converter and said control electrode of said second transistor for converting the current generated by said voltage-to-current converter into an inverted voltage opposite in polarity to the current and applying the inverted voltage to said control electrode of said second transistor; and a buffer circuit connected between said input terminal and said voltage-to-current converter for buffering the input signal voltage and supplying a buffered input signal voltage to said voltage-to-current converter.

2. The class-AB push-pull drive circuit of claim 1, wherein said buffer circuit comprises a constant current source and a third transistor having a first electrode connected to said second power supply terminal through said constant current source and to said voltage-to-current converter, a second electrode connected to said first power supply terminal, and a control electrode connected to said input terminal.

3. A class-AB push-pull drive circuit comprising:

first and second power supply terminals for supplying first and second power supply potentials, respectively;

input and output terminals for receiving an input signal voltage and outputting an output signal, respectively;

a first transistor having a polarity, a first electrode connected to said output terminal, a second electrode connected to said first power supply terminal, and a control electrode directly connected to said input terminal for receiving the input signal voltage, conduction of said first transistor being controlled in accordance with a potential difference between said control and second electrodes of said first transistor;

a second transistor having a polarity opposite to the polarity of said first transistor, a first electrode connected to said output terminal, a second electrode connected to said second power supply terminal, and a control electrode, conduction of said second transistor being controlled in accordance with a potential difference between said control and second electrodes of said second transistor;

a voltage-to-current converter having an output terminal and coupled to said input terminal for generating a current in response to the input signal voltage; and an inverting amplifier connected between said output terminal of said voltage-to-current converter and said control electrode of said second transistor for converting the current generated by said voltage-to-current converter into an inverted voltage opposite in polarity to the current and applying the inverted voltage to said control electrode of said second transistor wherein said voltage-to-current converter comprises a resistor and a third transistor having a first electrode connected to said inverting amplifier, a second electrode connected to said first power supply terminal through said resistor, and a control electrode coupled to said input terminal.

4. A class-AB push-pull drive circuit comprising:

first and second power supply terminals for supplying first and second power supply potentials, respectively;

input and output terminals for receiving an input signal voltage and outputting an output signal, respectively;

a first transistor having a polarity, a first electrode connected to said output terminal, a second electrode connected to said first power supply terminal, and a control electrode directly connected to said input terminal for receiving the input signal voltage, conduction of said first transistor being controlled in accordance with a potential difference between said control and second electrodes of said first transistor;

a second transistor having a polarity opposite to the polarity of said first transistor, a first electrode connected to said output terminal, a second electrode connected to said second power supply terminal, and a control electrode, conduction of said second transistor being controlled in accordance with a potential difference between said control and second electrodes of said second transistor;

a voltage-to-current converter having an output terminal and coupled to said input terminal for generating a current in response to the input signal voltage; and an inverting amplifier connected between said output terminal of said voltage-to-current converter and said control electrode of said second transistor for converting the current generated by said voltage-to-current converter into an inverted voltage opposite in polarity to the current and applying the inverted voltage to said control electrode of said second transistor wherein said voltage-to-current converter comprises a first resistor, a third transistor having a first electrode coupled to said input terminal through said first resistor, a second electrode coupled to said first power supply terminal, and a control electrode connected to said first electrode of said third transistor, and a fourth transistor having a first electrode connected to said inverting amplifier, a second electrode coupled to said first power supply terminal, and a control electrode connected to said control electrode of said third transistor.

5. The class-AB push-pull drive circuit of claim 4, wherein said voltage-to-current converter comprises a second resistor connected between said second electrode of said transistor and said first power supply terminal and a third resistor connected between said second electrode of said fourth transistor and said first power supply terminal.

6. A class-AB push-pull drive circuit comprising:

first and second power supply terminals for supplying first and second power supply potentials, respectively;

input and output terminals for receiving an input signal voltage and outputting an output signal, respectively;

a first transistor having a polarity, a first electrode connected to said output terminal, a second electrode connected to said first power supply terminal, and a control electrode directly connected to said input terminal for receiving the input signal voltage, conduction of said first transistor being controlled in accordance with a potential difference between said control and second electrodes of said first transistor;

a second transistor having a polarity opposite to the polarity of said first transistor, a first electrode connected to said output terminal, a second electrode connected to said second power supply terminal, and a control electrode, conduction of said second transistor being controlled in accordance with a potential difference between said control and second electrodes of said second transistor;

a voltage-to-current converter having an output terminal and coupled to said input terminal for generating a current in response to the input signal voltage; and an inverting amplifier connected between said output terminal of said voltage-to-current converter and said control electrode of said second transistor for converting the current generated by said voltage-to-current converter into an inverted voltage opposite in polarity to the current and applying the inverted voltage to said control electrode of said second transistor wherein said inverting amplifier comprises a resistor, a third transistor having a first electrode connected to said voltage-to-current converter through said resistor, a second electrode connected to said second power supply terminal, and a control electrode, and a fourth transistor having a first electrode connected to said first power supply terminal, a second electrode connected to said control electrode of said third resistor, and a control electrode connected to said voltage-to-current converter.

7. The class-AB push-pull drive circuit of claim 6, wherein said inverting amplifier comprises a just constant current source connected between said control electrode of said third transistor and said second power supply terminal.

8. The class-AB push-pull drive circuit of claim 7, comprising a second constant current source connected between said control electrode of said fourth transistor and said first power supply terminal.

* * * * *

UNITED STATES PATENT AND TRADEMARK OFFICE
CERTIFICATE OF CORRECTION

PATENT NO. : 5,334,950
DATED : August 2, 1994
INVENTOR(S) : Arimoto

It is certified that error appears in the above-indentified patent and that said Letters Patent is hereby corrected as shown below:

Column 14, line 43, after "said" (2nd. occ.) insert --third--.
Column 16, line 9, change "just" to --first--.

Signed and Sealed this

Thirteenth Day of December, 1994

Attest:

BRUCE LEHMAN

*Attesting Officer*  *Commissioner of Patents and Trademarks*